United States Patent [19]
Beasom

[11] Patent Number: 6,051,474
[45] Date of Patent: Apr. 18, 2000

[54] NEGATIVE BIASING OF ISOLATION TRENCH FILL TO ATTRACT MOBILE POSITIVE IONS AWAY FROM BIPOLAR DEVICE REGIONS

[75] Inventor: James Douglas Beasom, Melbourne Village, Fla.

[73] Assignee: Intersil Corporation, Palm Bay, Fla.

[21] Appl. No.: 08/968,618

[22] Filed: Nov. 12, 1997

Related U.S. Application Data

[62] Division of application No. 08/674,585, Jul. 2, 1996, abandoned, which is a continuation of application No. 07/811,169, Dec. 20, 1991, abandoned.

[51] Int. Cl.[7] ............................................... H01L 21/331
[52] U.S. Cl. .................... 438/359; 438/310; 438/361; 438/430
[58] Field of Search ................................. 438/310, 359, 438/361, 430

[56] References Cited

U.S. PATENT DOCUMENTS 4,470,062  9/1984  Muramatsu ........................ 257/505

*Primary Examiner*—Trung Dang
*Attorney, Agent, or Firm*—Charles E. Wands

[57] ABSTRACT

The tendency of mobile positive ions to be transported into device regions of a bipolar transistor is effectively minimized by surrounding the transistor with a 'positive ion'-attracting electric field, preferably by applying a prescribed bias to the fill material of a conductive trench that surrounds the device. The trench which surrounds a respective device to be protected contains dielectric material disposed along sidewalls of the trench. The trench contains material such as undoped polysilicon, which is capable of distributing a voltage, so that the material in the trench is insulated by dielectric material from an adjacent portion of the semiconductor substrate surrounded by the trench. In order to prevent mobile positive ions from moving into a device region in response to temperature bias stress and thereby degrade an operational parameter of the transistor, a predefined (relatively negative) bias voltage is applied to the material in the trench. By relatively negative is meant that the magnitude of the predefined bias voltage is established to be no more positive than half the difference between the most positive and the most negative of bias voltages that are applied to the device. Preferably, the prescribed bias voltage corresponds to the most negative of the plurality of bias voltages of the transistor.

8 Claims, 1 Drawing Sheet

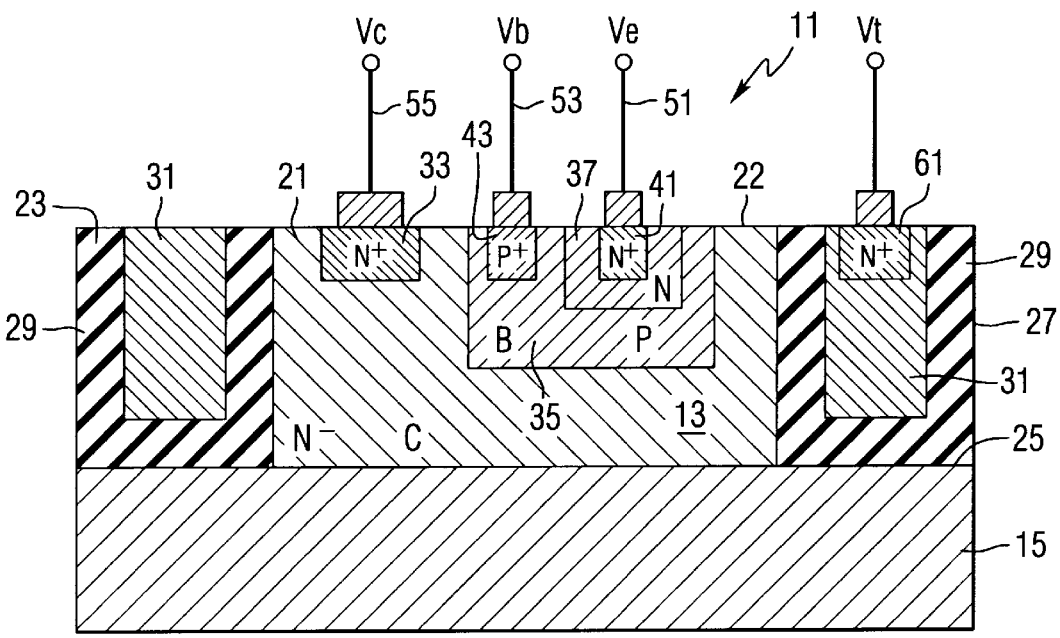

NEGATIVE BIASING OF ISOLATION TRENCH FILL TO ATTRACT MOBILE POSITIVE IONS AWAY FROM BIPOLAR DEVICE REGIONS

This is a division of application Ser. No. 08/674,585, filed Jul. 2, 1996, now abandoned, which is a continuation of application Ser. No. 07/811,169, filed Dec. 20, 1991, now abandoned.

FIELD OF THE INVENTION

The present invention relates in general to semiconductor devices and is particularly directed to the biasing of the fill material of a trench isolated integrated circuit architecture, so as to prevent mobile positive ions from moving into a device region in response to temperature bias stress and thereby degrading an operational parameter of the device.

BACKGROUND OF THE INVENTION

Within the variety of devices that may make up an integrated circuit architecture, some are very sensitive to the effects of temperature bias stress. Specifically, a number of circuit components include sensitive regions, such as active device regions of a bipolar transistor that are subject to being impacted by mobile positive ions. Such mobile ions may be transported into such regions in the presence of temperature bias stress, causing unwanted shifts in the electrical parameters of the transistor.

SUMMARY OF THE INVENTION

In accordance with the present invention, the tendency of mobile positive ions to be transported into device regions, particularly in a bipolar transistor, is effectively minimized by surrounding the device with a 'positive ion'-attracting electric field, preferably by applying a prescribed bias to the fill material of a conductive trench that surrounds the device. In particular, the present invention is readily incorporated in a trench-isolated bipolar transistor circuit architecture formed of a semiconductor substrate containing one or more trench-isolated bipolar transistor each of which is coupled to receive a respective plurality of bias voltages. The trench which surrounds a respective device to be protected contains dielectric material disposed along sidewalls of the trench. Material, such a polysilicon, which is capable of distributing a voltage, is formed in or fills the trench, so that the material in the trench is insulated by dielectric material from an adjacent portion of the semiconductor substrate surrounded by the trench.

In order to prevent mobile positive ions from moving into a device region in response to temperature bias stress and thereby degrade the intended operational characteristics of the transistor, a predefined (relatively negative) bias voltage is applied to the material in the trench. By relatively negative is meant that the magnitude of the predefined bias voltage is established to be no more positive than half the difference between the most positive and the most negative of bias voltages that are applied to the transistor. Preferably, the prescribed bias voltage is at least as negative as the most negative of the plurality of bias voltages of the transistor.

BRIEF DESCRIPTION OF THE DRAWINGS

The single FIGURE diagrammatically illustrates a non-limitative example of a trench-isolated integrated circuit architecture in which the present invention may be incorporated.

DETAILED DESCRIPTION

As pointed out briefly above, the trench biasing mechanism in accordance with the present invention serves to effectively minimize the tendency of mobile positive ions to be transported into the device regions of a bipolar transistor that are adjacent to the trench, by inducing a 'positive ion'-attracting electric field the emanates from the trench into the semiconductor island in which the bipolar transistor is formed, so that it imparts an attractive force in the vicinity of such regions. A typical example of a trench-isolated integrated circuit architecture in which the present invention may be incorporated is diagrammatically illustrated in FIG. 1, which shows an NPN bipolar transistor structure 11 formed within an N-type trench-isolated island 13 of a silicon-on-sapphire (SOS) structure. Island 13 is dielectrically isolated from adjacent semiconductor material by the dielectric material of underlying sapphire substrate 15, upon which an N-type silicon layer 21 has been formed, and by a trench 23 which extends from the top surface 22 of layer 21 down to the top surface 25 of sapphire substrate 15. It should be observed that the integrated circuit architecture in which the present invention may be employed is not limited to the example of an SOS structure shown in the FIGURE. Other structures, such as a silicon-on-insulator SOI, in general, or those employing junction isolation at the bottom surface of the device layer, for example, may be used.

Trench 23 surrounds island portion 13 which contains the (bipolar transistor) device to be protected and has its sidewalls 27 coated with a dielectric layer 29, such as silicon oxide. A material 31, such as undoped polysilicon, which is capable of distributing a trench bias voltage Vt (without current flow and accompanying IR drops), is formed in or fills trench 23, so that the voltage-distributing material in the trench is insulated from the semiconductor material of the island 13 and adjacent material of semiconductor layer 21. Trench fill material 31 is not limited to undoped polysilicon. It may include conductive material, resistive material and doped polysilicon, for example. What is required is that the trench contain a material that is capable of distributing the bias voltage Vt, so that the positive ion-attracting field effectively surrounds the bipolar island region.

Island 13 constitutes the collector region of the trench-isolated NPN transistor structure formed in layer 21 and contains an N+ collector contact region 33 and a P-type base region 35 formed in spaced apart surface portions of the island. Formed in P-type base region 35 is an N-type emitter region 37. Respective N+ emitter and P+ base contact regions 41 and 43 and collector contact region 33 are contacted with respective emitter, base and collector bias electrodes 51, 53 and 55. In addition to these device bias electrodes, the trench fill material 31 may contain an (N+) ohmic contact region 61 which is coupled to receive trench bias voltage Vt.

As described above, in order to prevent mobile positive ions that may be generated within the island 13 from being transported into a device region (base region 35) in response to temperature bias stress, which would degrade the characteristics of the transistor, trench bias voltage Vt is set at a relatively negative value. By relatively negative is meant that the magnitude of trench bias voltage Vt is established to be no more positive than half the difference between the most positive and the most negative of the bias voltages that are applied to the device regions of island 13. Preferably, the prescribed bias voltage corresponds to the most negative of the plurality of bias voltages of the transistor. Thus, for example, in the case of a telecommunications circuit which typically operates between +5 volts and −48 volts, the voltage differential is 53 volts, so that the trench bias voltage Vt would be set at a value no more positive than −26.5 volts and preferably at −48 volts.

It is to be observed that the trench bias mechanism of the present invention is device-specific; that is, each device to be protected is surrounded by its own relatively negative-biasing trench. Where an overall integrated circuit architecture contains multiple devices, each device is delineated/bordered by a respective trench. Each device may be bordered by its own trench, or adjacent devices may share and border a trench between them. In this latter circumstance, one side of the trench may form a boundary of one device island, while the opposite side of the trench may form a boundary of another device island. The bias voltage applied to the trench is defined in accordance with the bias voltage parameters of the device bordered by that trench. A positive ion-attracting trench does not surround multiple devices, even if those devices use the same set of bias voltages. Each device is located in its own separate island region.

The positive ion-attracting mechanism of the present invention serves to improve the reliability of a bipolar transistor by drawing mobile positive ions away from device regions in the presence of temperature induced stress and thereby differs from the biasing of trench fill material of a CMOS architecture for the purpose of turning off a parasitic MOS device that may be created along the sidewall of the dielectric material surrounding the island. In such an application, the PMOS trench is typically tied to the positive supply, which will not serve to attract mobile positive ions away from device regions, but rather repel them toward such regions. Also, some architectures connect the trench to AC ground in order to prevent capacitive coupling between multiple (analog and digital) portions of a CMOS circuit. These circuits do not provide individual trench isolation bias for respective bipolar circuits.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method comprising the steps of:
    (a) providing a semiconductor integrated circuit structure having a support substrate, a semiconductor layer of a first conductivity type having a top surface, a bottom surface overlying said support substrate, and side surfaces, said semiconductor layer containing a semiconductor device having at least one PN junction, said semiconductor device including a semiconductor region of a second conductivity type, opposite to said first conductivity type, and forming a first PN junction of said at least one PN junction with said semiconductor layer, and wherein no PN junction, including said first PN junction, intersects a side surface of said semiconductor layer, and wherein said semiconductor device is coupled to receive a plurality of bias voltages, a trench surrounding said semiconductor layer and having sidewalls which define said side surfaces of said semiconductor layer, dielectric material disposed along said sidewalls and also on a bottom portion of said trench, and material capable of distributing a voltage therethrough formed in said trench, so as to be insulated from said semiconductor layer by dielectric material disposed along said sidewalls of said trench and being insulated from said substrate by dielectric material disposed along said bottom portion of said trench, said material capable of distributing a voltage therethrough being confined to said trench, so that said material capable of distributing a voltage therethrough does not to extend over said top surface of said semiconductor layer and overlie any PN junction, including said first PN junction; and
    (b) causing said material capable of distributing a voltage therethrough in said trench to electrically prevent mobile positive ions from being transported into said semiconductor region in response to temperature bias stress and thereby affecting an operational parameter of said semiconductor device.

2. A method according to claim 1, wherein step (b) comprises applying a prescribed bias voltage to the material in said trench capable of distributing a voltage, and establishing the magnitude of said prescribed bias voltage at a voltage which effectively prevents mobile positive ions from being transported into said semiconductor region and causing an unwanted shift in an electrical parameter of said semiconductor integrated circuit structure.

3. A method according to claim 2, wherein step (b) comprises establishing the magnitude of said prescribed bias voltage at a voltage which effectively minimizes the tendency of mobile positive ions to be transported into said semiconductor region and causing an unwanted shift in an electrical parameter of said semiconductor integrated circuit structure and is no more positive than half the difference between a most positive one and a most negative one of said plurality of bias voltages.

4. A method according to claim 3, wherein said prescribed bias voltage corresponds to the most negative one of said plurality of bias voltages.

5. A method according to claim 1, wherein said semiconductor device is a bipolar transistor device.

6. A method comprising the steps of:
    (a) providing a bipolar transistor device architecture formed of a support substrate, a semiconductor layer having a top surface, a bottom surface overlying said support substrate, and side surfaces, said semiconductor layer containing a bipolar transistor device comprising a collector region, a base region which forms a collector-base PN junction with said collector region, and an emitter region which forms an emitter-base PN junction with said base region, said emitter-base PN junction being spaced apart from said side surfaces of said semiconductor layer so as to not intersect said side surface of said semiconductor layer, and wherein the collector, base and emitter regions of said bipolar semiconductor device are coupled to receive respective collector, base and emitter bias voltages, a trench surrounding said semiconductor layer and having sidewalls which define said side surfaces of said semiconductor layer, dielectric material disposed along said sidewalls and also on a bottom portion of said trench, and material capable of distributing a voltage therethrough formed in said trench, so as to be insulated from said semiconductor layer by dielectric material disposed along said sidewalls of said trench and being insulated from said substrate by dielectric material disposed along said bottom portion of said trench, said material capable of distributing a voltage therethrough being confined to said trench, so as to not extend over said top surface of said semiconductor layer and overlie said collector-base PN junction or said emitter-base PN junction; and (b) causing said material capable of distributing a voltage therethrough in said trench to electrically prevent mobile positive ions from moving into said base region in response to temperature bias stress and thereby affecting an operational parameter of said bipolar transistor device.

7. A method according to claim 6, wherein step (b) comprises applying a prescribed bias voltage to the material in said trench, and establishing the magnitude of said prescribed bias voltage at a voltage which effectively prevents mobile positive ions from being transported into said base region and causing an unwanted shift in an electrical parameter of said bipolar transistor device and is no more positive than half the difference between a most positive one and a most negative one of said respective collector, base and emitter bias voltages.

8. A method according to claim 7, wherein said prescribed bias voltage corresponds to the most negative one of said collector, base and emitter bias voltages.

* * * * *